US011432431B1

(12) United States Patent
Embleton et al.

(10) Patent No.: US 11,432,431 B1
(45) Date of Patent: Aug. 30, 2022

(54) TWO-PHASE COOLING APPARATUS

(71) Applicant: Dell Products L.P., Round Rock, TX (US)

(72) Inventors: Steven Thomas Embleton, Austin, TX (US); Jon Taylor Fitch, Austin, TX (US); Jimmy Doyle Pike, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/226,350

(22) Filed: Apr. 9, 2021

(51) Int. Cl.
*H05K 7/20* (2006.01)
*G06F 1/20* (2006.01)

(52) U.S. Cl.
CPC ............ *H05K 7/203* (2013.01); *G06F 1/20* (2013.01); *H05K 7/20318* (2013.01); *H05K 7/20327* (2013.01)

(58) Field of Classification Search
CPC ............ H05K 7/203; H05K 7/20809; H05K 7/20818; H05K 7/20318; H05K 7/20327; H05K 7/20772; H05K 7/20236; H05K 7/20309; H05K 7/20836; H05K 7/20345; H05K 7/208; H05K 7/20281; H05K 7/20936; H05K 7/20781; H05K 1/0203; H05K 7/2029; F28F 9/26; F28F 13/02; F28F 2250/08; G06F 1/20; G06F 2200/201
USPC ....... 361/700, 699, 689, 688, 704, 698, 720, 361/679.53; 165/104.33, 80.4, 104.21; 62/259.2; 257/714, 715, E23.098, 713
See application file for complete search history.

(56) References Cited

U.S. PATENT DOCUMENTS 7,726,870 B1 *  6/2010  Lott ..................... B01F 35/184
                                                       366/173.1
10,925,188 B1 *  2/2021  Keehn ................ H05K 7/20754

OTHER PUBLICATIONS

Markowitz, A., Boiling and condensation in a liquid-filled enclosure. Diss. Massachusetts Institute of Technology, 1971.
Tuma, Phillip E. "The merits of open bath immersion cooling of datacom equipment." *2010 26th Annual IEEE Semiconductor Thermal Measurement and Management Symposium (Semi-Therm)*. IEEE, 2010.
Gess, Joshua. Experimental Investigation of a Liquid Immersion Cooled Electronics Module using Two-Phase Heat Transfer for Thermal Management. Diss. 2015.
Fincher, Seth. Numerical simulations of boiling in dielectric fluid immersion cooling scenarios of high power electronics. Diss. 2014.

* cited by examiner

*Primary Examiner* — Mandeep S Buttar
(74) *Attorney, Agent, or Firm* — Baker Botts, L.L.P.

(57) ABSTRACT

A two-phase cooling apparatus for an information handling system, including a container holding dielectric fluid, the dielectric fluid having a vapor-fluid boundary within the container, the container further containing a printed circuit board (PCB) including computing components, with the dielectric fluid surrounding the PCB and the computing components, the dielectric fluid decreasing a temperature of the PCB by removing heat from the PCB in the form of vaporization; a pump positioned within the container, the pump capturing a portion of vapor of the dielectric fluid, at the vapor-fluid boundary, that results from the vaporization of the dielectric fluid; and a diffuser positioned within the container and coupled to the pump to introduce the captured vapor into the dielectric fluid.

20 Claims, 7 Drawing Sheets

TWO-PHASE COOLING APPARATUS

BACKGROUND

Field of the Disclosure

The disclosure relates generally to an information handling system, and in particular, a two-phase cooling apparatus for the information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As information handling system increase in performance and power usage, the cooling of the information handling systems is of increasing importance.

SUMMARY

Innovative aspects of the subject matter described in this specification may be embodied in a two-phase cooling apparatus for an information handling system, including a container holding dielectric fluid, the dielectric fluid having a vapor-fluid boundary within the container, the container further containing a printed circuit board (PCB) including computing components, with the dielectric fluid surrounding the PCB and the computing components, the dielectric fluid decreasing a temperature of the PCB by removing heat from the PCB in the form of vaporization; a pump positioned within the container, the pump capturing a portion of vapor of the dielectric fluid, at the vapor-fluid boundary, that results from the vaporization of the dielectric fluid; and a diffuser positioned within the container and coupled to the pump to introduce the captured vapor into the dielectric fluid.

Other embodiments of these aspects include corresponding methods, systems, apparatus, and computer programs, configured to perform the actions of the methods, encoded on computer storage devices.

These and other embodiments may each optionally include one or more of the following features. For instance, the apparatus further including a condenser positioned opposite of the diffuser, the condenser condensing another portion of the dielectric fluid back into dielectric fluid for holding by the container. The dielectric fluid is a low-boiling point dielectric fluid. The diffuser introduce the captured vapor as bubbles into the dielectric fluid. One or more diverter fins included within the container to guide a flow of the bubbles towards the vapor-fluid boundary. The diverter fins guide the flow of the bubbles from contacting the computing components of the PCB. A filter coupled to the pump to filter the dielectric fluid.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
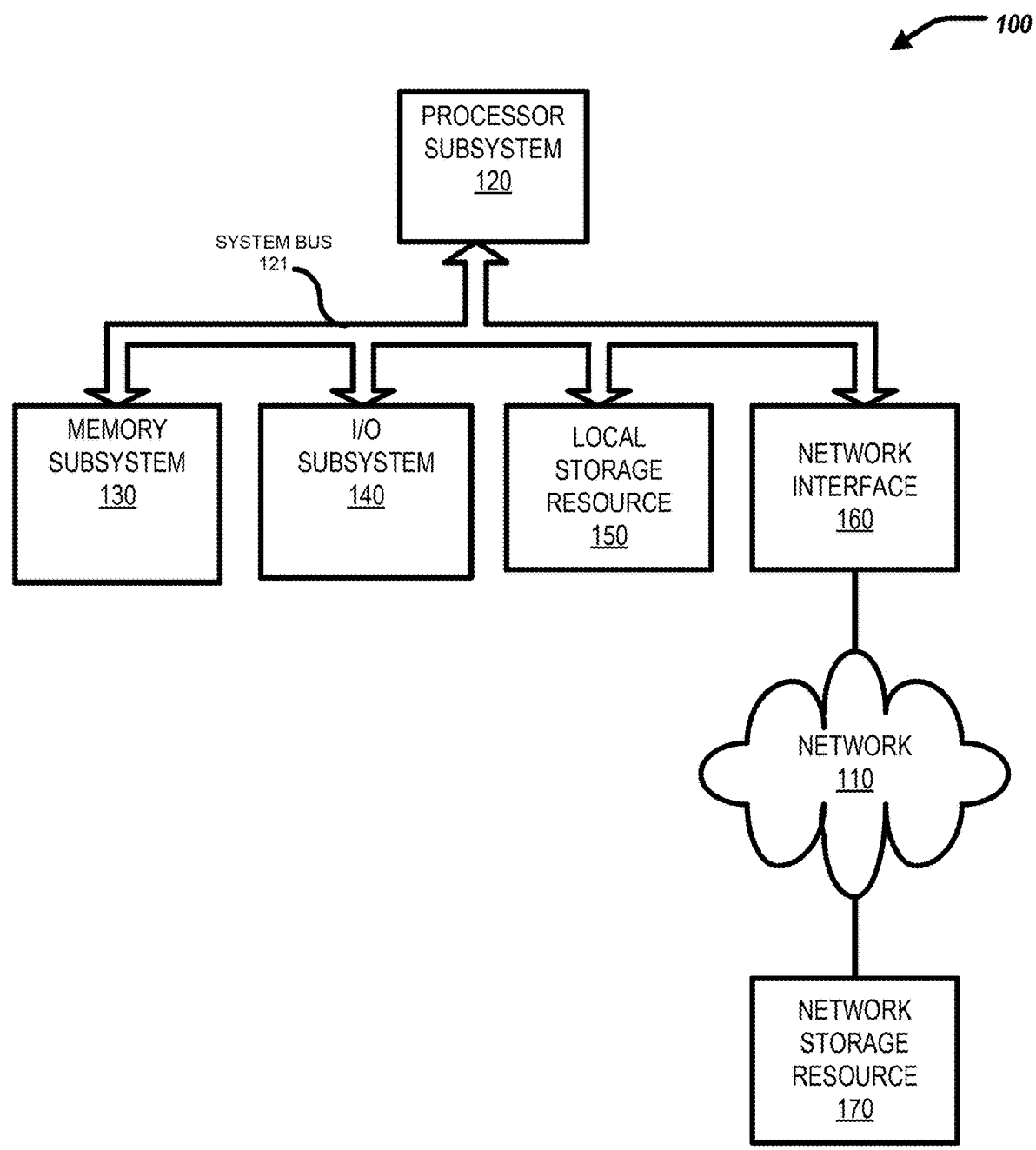
FIG. 1 is a block diagram of selected elements of an embodiment of an information handling system.

This disclosure discusses methods and systems for cooling of an information handling system. In short, the information handling system can include a printed circuit board (PCB) that includes computing components. The PCB can be included within a container. The container can further include a dielectric material. As the temperature of the PCB and computing components increases (due to use), the dielectric material can vaporize, drawing heat away from the PCB and the computing components. The vaporized dielectric material can be captured, and pumped into a diffuser for introduction back into the container and the existing dielectric fluid, thus improving thermal performance of the PCB and the computing components.

Specifically, this disclosure discusses a two-phase cooling apparatus for an information handling system, including a container holding dielectric fluid, the dielectric fluid having a vapor-fluid boundary within the container, the container further containing a printed circuit board (PCB) including computing components, with the dielectric fluid surrounding the PCB and the computing components, the dielectric fluid decreasing a temperature of the PCB by removing heat from the PCB in the form of vaporization; a pump positioned within the container, the pump capturing a portion of vapor of the dielectric fluid, at the vapor-fluid boundary, that results from the vaporization of the dielectric fluid; and a diffuser positioned within the container and coupled to the pump to introduce the captured vapor into the dielectric fluid.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-6 wherein like numbers are used to indicate like and corresponding parts. Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2A:
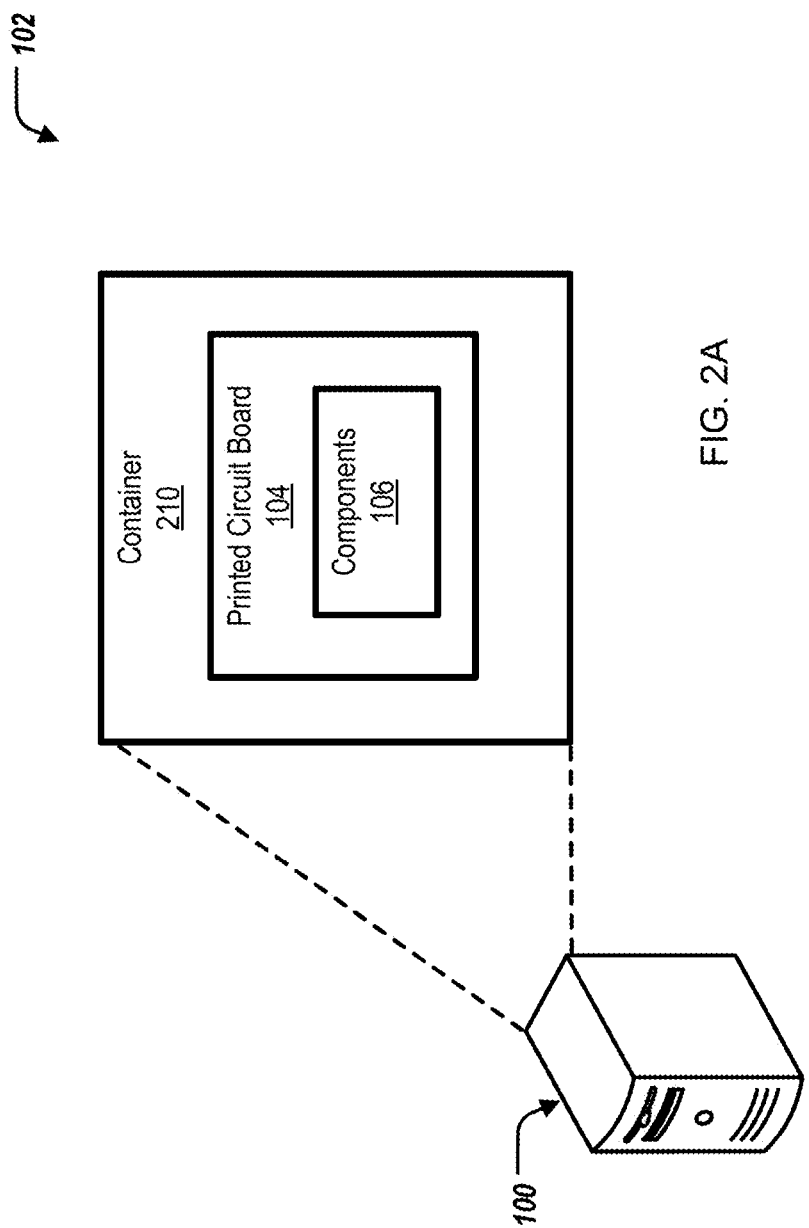
FIG. 2A is a block diagram of the information handling system including a container and a printed circuit board.

FIG. 2A illustrates the environment 102 (e.g., a computing environment 102 and/or a physical environment 102) including the information handling system 100. The information handling system 100 can include a container 210. For example, the container 210 can physically be included by a physical casing of the information handling system 100. The container 210 can include one or more physical computing components of the information handling system 100. Specifically, the information handling system 100 can include one or more printed circuit boards, including a motherboard (main printed circuit board). In some examples, the container 210 contains a portion of the components of the information handling system 100 while other components of the information handling system 100 are positioned outside of the container 210, depending on the application desired.

Figure 2B:
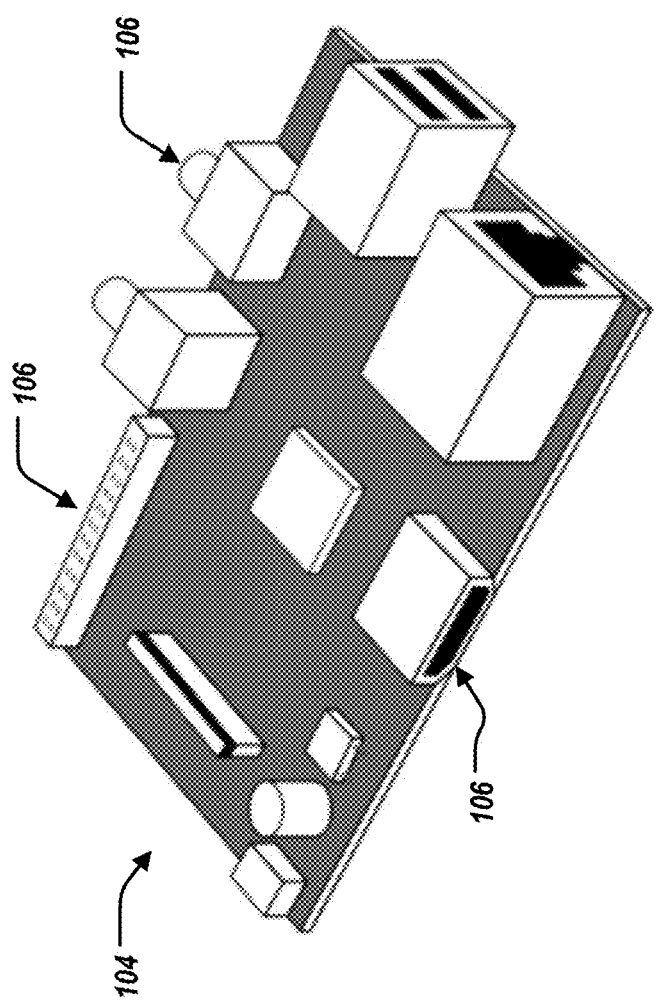
FIG. 2B is a block diagram of an example printed circuit board.

Referring to FIGS. 2A and 2B, as shown, the container 210 can include a printed circuit board (PCB) 104 or a motherboard 104. The PCB 104 can include computing components 106. The information handling system 100 can include two or more PCBs 104 depending on the application desired. Each PCB 104 can include any number of computing components 106.

Figure 3:
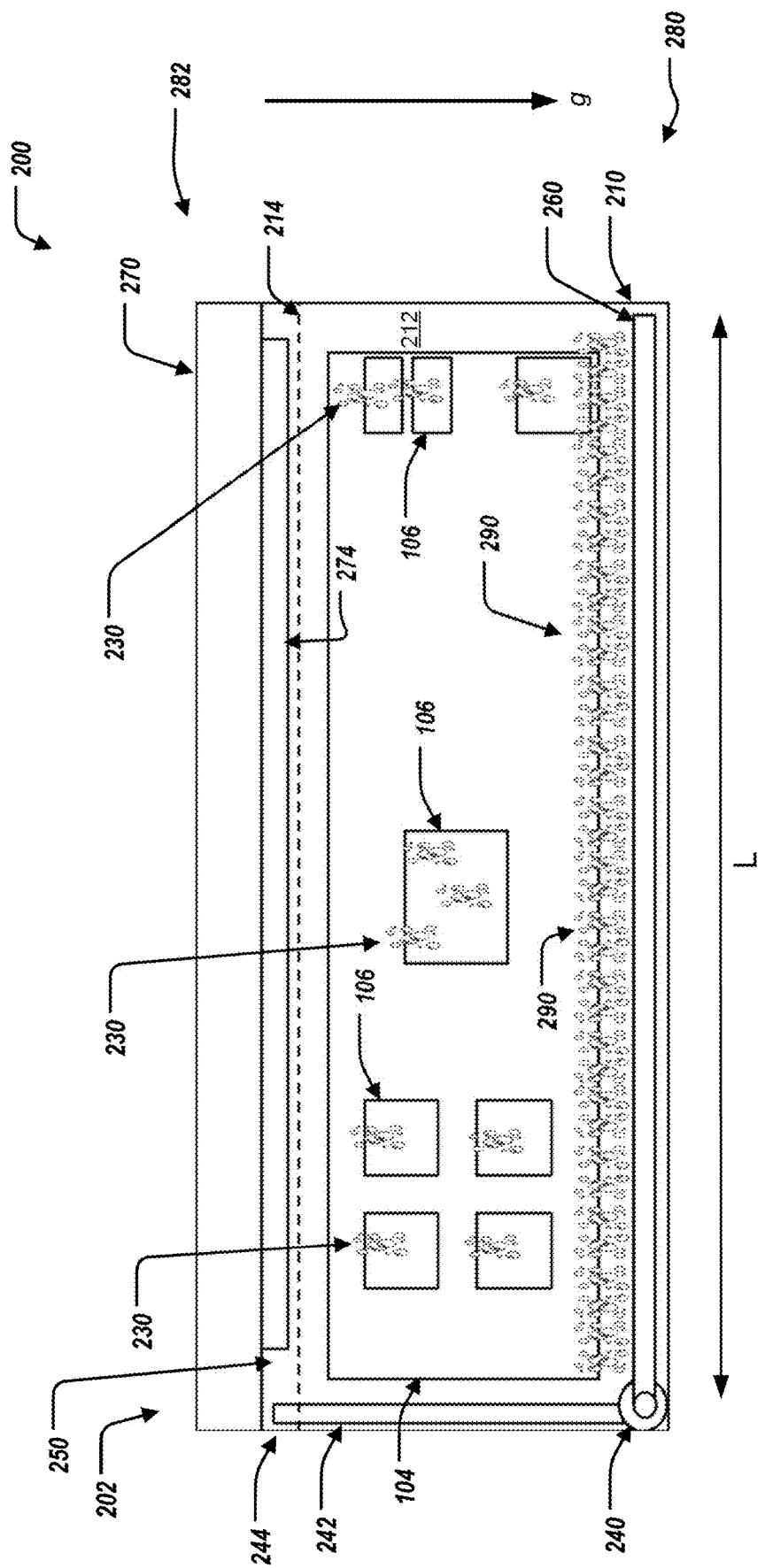
FIG. 3 illustrates a block diagram of a two-phase cooling system for an information handling system.

Turning to FIG. 3, FIG. 3 illustrates an environment 200 including a two-phase cooling apparatus 202 (or cooling apparatus 202) and the PCB 104.

The cooling apparatus 202 can include the container 210 that holds a dielectric fluid 212. The dielectric fluid 212 can define a vapor-fluid boundary 214 within the container 210. The PCB 104 is contained within the container 210. The dielectric fluid 212 surrounds the PCB 104 and the computing components 106.

To that end, the dielectric fluid 212 can decrease a temperature of the PCB 104 and the computing components 106 by removing heat from the PCB 104 and the computing components 106 in the form of vaporization. Specifically, the dielectric fluid 212 is a low-boiling point dielectric fluid. For example, the dielectric fluid 212 can be produced by the 3M™ company of Maplewood, Minn., U.S., and have commercial names of Fluorinert™ Electronic Fluid FC-72; Novec™ 7100 Engineering Fluid; and/or Novec™ 649 Engineering Fluid. However, other types of low-boiling point dielectric fluids are possible depending on the application desired.

As the temperature of the PCB 104 and the computing components 106 increases (e.g., due to usage of the PCB 104 and the computing components 106), the dielectric fluid 212 can boil. Specifically, the dielectric fluid 212 can boil at a temperature below a (desired) surface temperature that the PCB 104 and the computing components 106 are kept at. The desired surface temperature of the PCB 104 and the surface components 106 can be provided by a manufacturer of the PCB 104 and the computing components 106, or set by a user of the PCB 104 (e.g., a user of the information handling system 100). The desired surface temperature of the PCB 104 and the surface components 106 can be a temperature associated with a desired performance level (e.g., processing speed) of the PCB 104 and the computing components 106. For example, the dielectric fluid 212 can be associated with a boiling temperature of approximately 49 degrees Celsius.

As the surface temperature of the PCB 104 and the computing components 106 rises (e.g., resulting from processing at the PCB 104 and/or the computing components 106), the temperature of the dielectric fluid 212 rises (as the dielectric fluid 212 is in contact with the PCB 104 and the component components 106 within the container 210). When the temperature of the dielectric fluid 212 rises above the boiling temperature associated with the dielectric fluid 212, a portion of the dielectric fluid 212 can have a phase transformation from fluid to gas (vaporization), shown as bubbles 230. The bubbles 230 can travel in a direction opposite to gravity (shown by line g) to the vapor-fluid boundary 214 (e.g., "rise" to the vapor-fluid boundary 214), and subsequently be contained with a gas portion 250 of the container 210 (e.g., the gas portion 250 can include ambient air, and/or vapor of the dielectric fluid 212). The vapor-fluid boundary 214 can be a boundary between the dielectric fluid 212 and the gas portion 250.

A pump 240 can be positioned within the container 210. The pump 240 can include a tube 242, with a portion 244 of the tube 242 positioned proximate to the vapor-fluid boundary 214. For example, the portion 244 of the tube 242 can be positioned within the gas portion 250 of the container 210. The pump 240 can capture a portion of the vapor of the dielectric fluid 212 at the vapor-fluid boundary 214—i.e., the pump 240 can capture the bubbles 230 that cross to the vapor-fluid boundary 214. Specifically, the pump 240 can capture, via the tube 242, the vapor of the dielectric fluid 212 that is within the gas portion 250 of the container 210 that results from the vaporization of the dielectric fluid 212 (via the bubbles 230 that rise to the vapor-fluid boundary 214).

A condenser 270 can be positioned within the container 210. The condenser 270 can facilitate a state change of a portion of the vapor of the dielectric fluid 212 as the bubbles 230 reach the vapor-fluid boundary 214 and are included within the gas portion 250 of the container 210. That is, the condenser 270 can condense the portion of the vapor of the dielectric fluid 212 into a fluid form—e.g., condense the vapor of the dielectric fluid 212 back into dielectric fluid 212 for holding by the container 210 (the condensed vapor "drips" back into the dielectric fluid 212 in the direction along gravity g). The condenser 210 can be associated with a temperature that is less than the boiling temperature of the dielectric fluid 212.

The condenser 270 can further include condenser fins 272 for facilitating condensing the portion of the vapor of the dielectric fluid 212 into the fluid form. In some examples, the vapor-fluid boundary 214 is proximate to the condenser fins 272 (e.g., the vapor-fluid boundary 214 is located at proximate to a distal end 274 of the condenser fins 272). Specifically, the location of the vapor-fluid boundary 214 relative to the condenser fins 272 is such that i) the vapor-fluid boundary 214 is not in contact with the condenser fins 272 and ii) a gap between the vapor-fluid boundary 214 and the condenser fins 272 is such that wiping action at the condenser fins 272 is increased, described further herein. The condenser fins 272 can include two or more fins.

A diffuser 260 can be positioned within the container 210. The diffuser 260 can be coupled to the pump 240. The diffuser 260 can be positioned opposite to the condenser 270. That is, the diffuser 260 is located at a first end 280 of the container 210 and the condenser 270 is located at a second end 282 of the container 210.

The diffuser 260 can introduce the captured vapor into the dielectric fluid 212. That is, the pump 240 can provide the captured vapor of the dielectric fluid 212 (captured proximate to the vapor-fluid boundary 214) to the diffuser 260. In other words, the pump 240 can push the captured vapor through the diffuser 260 and into the dielectric fluid 212 as bubbles 290, with the diffuser 260 introducing the captured vapor as bubbles 290 into the dielectric fluid 212. The bubbles 290 can travel in a direction opposite to gravity (shown by the line g) to the vapor-fluid boundary 214 (e.g., "rise" to the vapor-fluid boundary 214).

The diffuser 260 is of a length L. In some examples, the length of the diffuser 260 is greater than the length of the PCB 104. In some examples, the length of the diffuser 260 is greater in length than the condenser fins 272. To that end, when the diffuser 260 is of a length approximate to the length of the condenser fins 272 (or greater), the diffuser 260 can provide the captured vapor as bubbles 290 into the dielectric fluid 212 across the full length of the condenser fins 272 to increase wiping action at the condenser fins 272. That is, a number of the condenser fins 272 that are exposed to "vigorous sloshing" of the dielectric fluid 212. is increased, thus improving the condensation limit (the bubbles 290 burst proximate to the vapor-fluid boundary 214 and "slosh" dielectric fluid 212 over the condenser fins 272 wiping them to enhance the heat transfer of the system). This wiping action with the bubbles 290 is greater than the wiping action the condenser fins 272 would normally experience from bubbles 230 only generated from boiling proximate to the computing components 106. Moreover, by the diffuser 260 diffusing the bubbles 290 (captured vapor) across the full length of the condenser fins 272, the diffuser 260 is able to fully distribute the bubbles 290 (captured vapor) within the dielectric fluid 212 to increase a volume of the dielectric fluid 212.

In some examples, the diffuser 260 can provided the captured vapor as bubbles 290 into the dielectric fluid 212 specifically proximate (under) to the components 206. That is, the diffuser 260 can direct flow of the bubbles from the diffuser 260 across the components 206.

In some examples, the diffuser 260 can control the rate of injection of the captured vapor as the bubbles 290 back into the dielectric fluid 212. As a result, a location of the vapor-fluid boundary 214 relative to the condenser fins 272 can be adjusted based on the rate of injection of the captured vapor as the bubbles 290 back into the dielectric fluid 212. Specifically, by adjusting the rate of injection of the captured vapor as the bubbles 290 into the dielectric fluid 212 can achieve the same benefits of the vapor-fluid boundary 214 proximate to the condenser fins 272 with less dielectric fluid 212. Furthermore, the location of the vapor-fluid boundary 214 relative to the condenser fins 272 can be adjusted such that as vapor is generated (as the bubbles 230 that travel in the direction opposite to gravity (shown by line g) to the vapor-fluid boundary 214), the gap between the vapor-fluid boundary 214 and the condenser fins 272 is reduced. This reduction in gap can be counteracted by reducing the rate of injection of the captured vapor as the bubbles 290 back into the dielectric fluid 212 to maintain a desired gap between the vapor-fluid boundary 214 and the condenser fins 272.

Figure 4B:
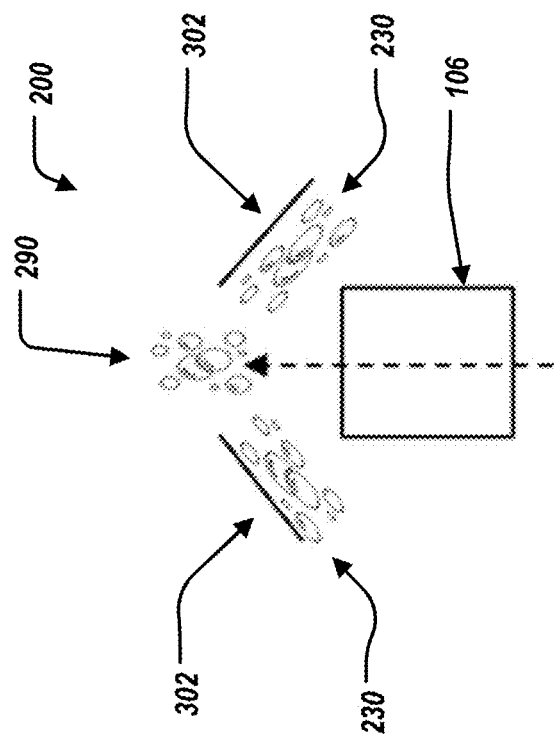
FIGS. 4A, 4B illustrates diverter fins of the two-phase cooling system.
Figure 4A:
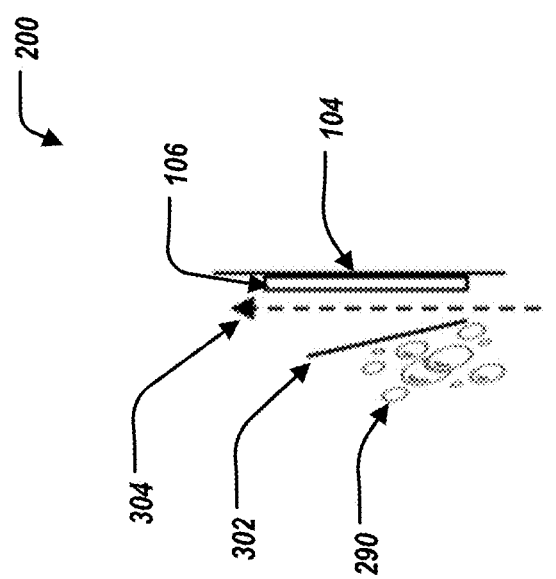

FIG. 4A illustrates a side view of a portion of the environment 200. Specifically, a diverter fin 302 can be positioned within the container 210. The diverter fin 302 can guide a flow of the bubbles 290 towards the vapor-fluid boundary 214, along the direction 304. Specifically, the diverter fin 302 can guide the flow of the bubbles 290 proximate to the component 106 while minimizing touching/contacting of the component 106 by the bubbles 290. Furthermore, the diverter fin 302 can guide the flow of the bubbles 290 to form bubble columns above (proximate) to the component 106 to introduce a fluid flow, as shown in FIG. 4B. In other words, the diverter fin 302 creates a velocity profile of the flow of the bubbles 230 across the component 106.

Figure 5:
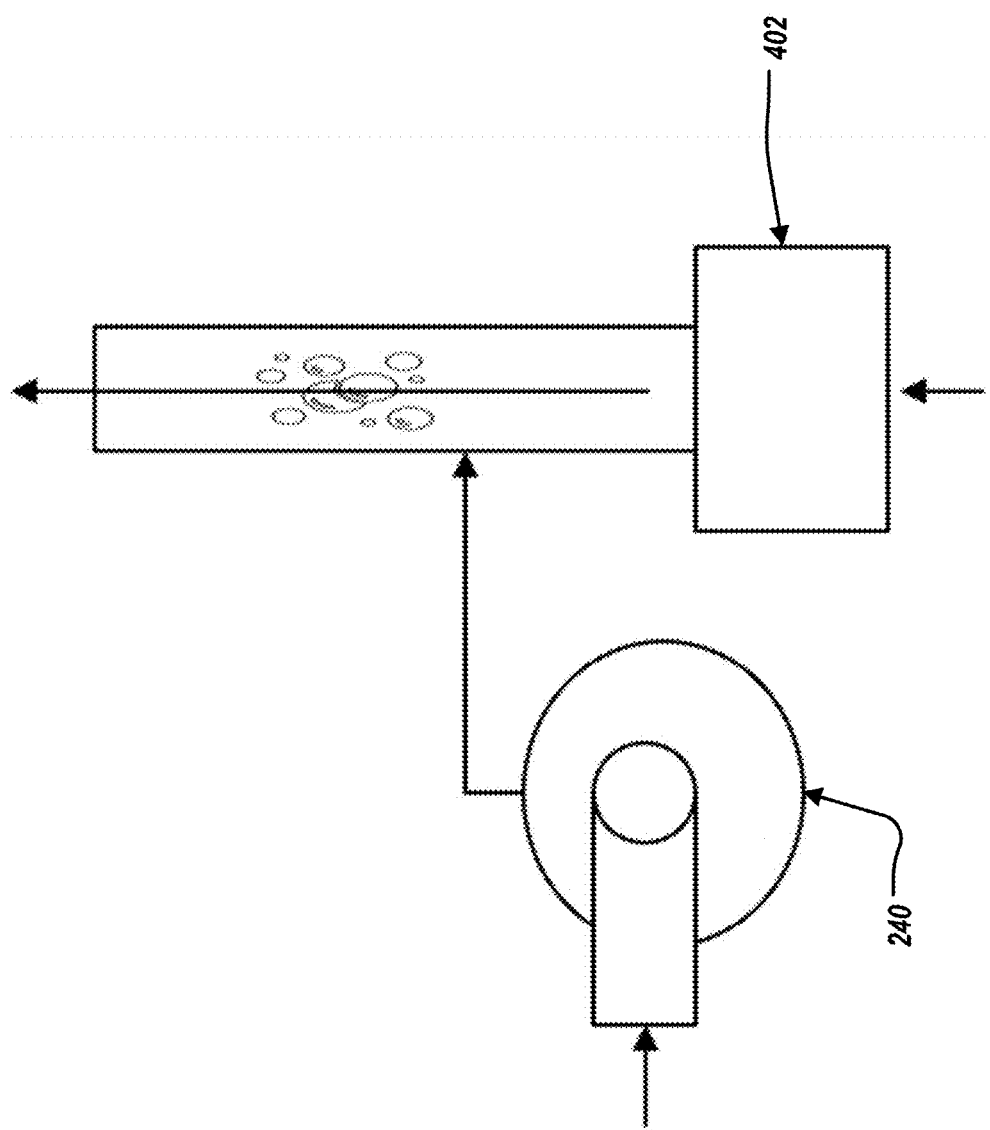
FIG. 5 illustrates a filter of the two-phase cooling system.

Referring to FIG. 5, a filter 402 can be positioned within the container 210. The filter 402 can be coupled to the pump 240 to filter the captured vapor and the dielectric fluid 212. Specifically, as the dielectric fluid 212 rises above the boiling temperature associated with the dielectric fluid 212 for vaporization, plasticizers can leach into the dielectric fluid 212. The plasticizers can become deposited onto the computing components 106 and/or the PCB 104, thus decreasing heat transfer from the PCB 104 and/or the computing components 106 to the dielectric fluid 212 and decreasing overall thermal performance. To that end, the filter 402 can filter the dielectric fluid 212 (e.g., by a charcoal filter of the filter 402). The bubbles 290 can facilitate the filtering of the dielectric fluid 212 when pushed through the filter 402.

Figure 6:
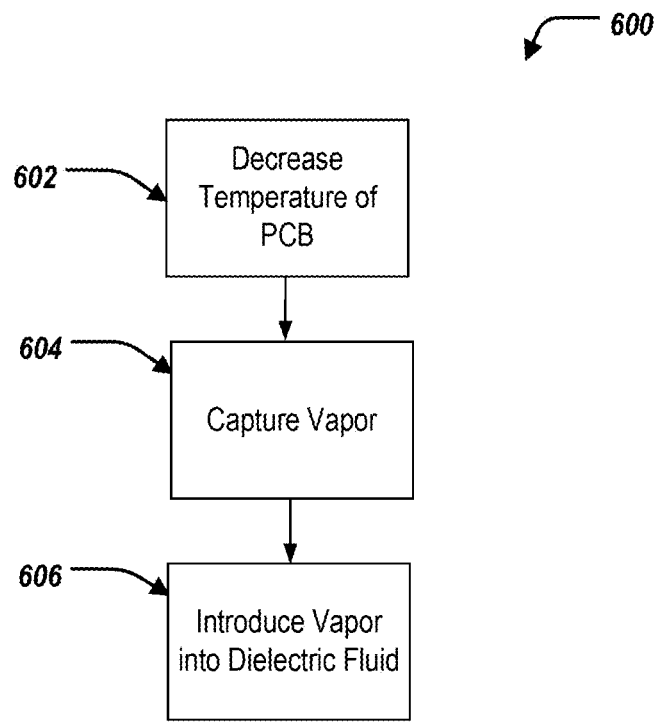
FIG. 6 illustrates a method for cooling the information handling system.

FIG. 6 illustrates a flowchart depicting selected elements of an embodiment of a method 600 for cooling of an information handling system. The method 600 may be performed by the cooling apparatus 202, and with reference to FIGS. 1-5. It is noted that certain operations described in method 600 may be optional or may be rearranged in different embodiments.

A temperature of the PCB 104 and the computing components 106 is decreased (602). Specifically, the temperature of the PCB 104 is decreased by removing heat from the PCB 104 and the computing components 106 by vaporization of the dielectric fluid 212 that surrounds the PCB 104 and the computing components 106 within the container 210 that holds the dielectric fluid 212, and the PCB 104. A portion of the vapor of the dielectric fluid 212 is captured at the vapor-fluid boundary 214 within the container 212 (604). Specifically, the pump 240 can capture the vapor of the dielectric fluid 212 via the tube 242 proximate to the vapor-fluid boundary 214 and the gas portion 250 of the container 210. The captured vapor is introduced into the dielectric fluid 212 (606). Specifically, the diffuser 260 can introduce the captured vapor into the dielectric fluid 212. That is, the pump 240 can provide the captured vapor of the dielectric fluid 212 (captured proximate to the vapor-fluid boundary 214) to the diffuser 260 that introduces the captured vapor into the dielectric fluid 212.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A two-phase cooling apparatus for an information handling system, including:
   a container holding dielectric fluid, the dielectric fluid having a vapor-fluid boundary within the container, the container further containing a printed circuit board (PCB) including computing components, with the dielectric fluid surrounding the PCB and the computing components, the dielectric fluid decreasing a temperature of the PCB by removing heat from the PCB in the form of vaporization;
   a pump positioned within the container, the pump capturing a portion of vapor of the dielectric fluid, at the vapor-fluid boundary, that results from the vaporization of the dielectric fluid; and
   a diffuser positioned within the container and coupled to the pump to introduce the captured vapor into the dielectric fluid.

2. The cooling apparatus of claim 1, further comprising:
   a condenser positioned opposite of the diffuser, the condenser condensing another portion of the dielectric fluid back into dielectric fluid for holding by the container.

3. The cooling apparatus of claim 1, wherein the dielectric fluid is a low-boiling point dielectric fluid.

4. The cooling apparatus of claim 1, wherein the diffuser introduce the captured vapor as bubbles into the dielectric fluid.

5. The cooling apparatus of claim 4, further comprising:
   one or more diverter fins included within the container to guide a flow of the bubbles towards the vapor-fluid boundary.

6. The cooling apparatus of claim 5, wherein the diverter fins guide the flow of the bubbles from contacting the computing components of the PCB.

7. The cooling apparatus of claim 1, further comprising:
   a filter coupled to the pump to filter the dielectric fluid.

8. An information handling system, comprising:
   a printed circuit board including computing components;
   a two-phase cooling apparatus, comprising:
      a container holding dielectric fluid, the dielectric fluid having a vapor-fluid boundary within the container, wherein the PCB is contained within the container and the dielectric fluid surrounds the PCB and the computing components, the dielectric fluid decreasing a temperature of the PCB by removing heat from the PCB in the form of vaporization;
      a pump positioned within the container, the pump capturing a portion of vapor of the dielectric fluid, at the vapor-fluid boundary, that results from the vaporization of the dielectric fluid; and
      a diffuser positioned within the container and coupled to the pump to introduce the captured vapor into the dielectric fluid.

9. The information handling system of claim 8, further comprising:
   a condenser positioned opposite of the diffuser, the condenser condensing another portion of the dielectric fluid back into dielectric fluid for holding by the container.

10. The information handling system of claim 8, wherein the dielectric fluid is a low-boiling point dielectric fluid.

11. The information handling system of claim 8, wherein the diffuser introduce the captured vapor as bubbles into the dielectric fluid.

12. The information handling system of claim 11, further comprising:
   one or more diverter fins included within the container to guide a flow of the bubbles towards the vapor-fluid boundary.

13. The information handling system of claim 12, wherein the diverter fins guide the flow of the bubbles from contacting the computing components of the PCB.

14. The information handling system of claim 8, further comprising:
   a filter coupled to the pump to filter the dielectric fluid.

15. A method of cooling an information handling system, the method comprising: decreasing a temperature of a printed circuit board (PCB) that includes computing components and is positioned within a container holding a dielectric fluid that surrounds the PCB and the computing components by removing heat from the PCB in the form of vaporization; a pump positioned within the container, the pump capturing a portion of vapor of the dielectric fluid at a vapor-fluid boundary within the container, the vapor resulting from the vaporization of the dielectric fluid; and a diffuser positioned within the container and coupled to the pump to introduce the captured vapor into the dielectric fluid.

16. The method of claim 15, further comprising:
condensing another portion of the dielectric fluid back into dielectric fluid for holding by the container.

17. The method of claim 15, wherein the dielectric fluid is a low-boiling point dielectric fluid.

18. The method of claim 15, wherein introducing the captured vapor further includes introducing the captured vapor as bubbles into the dielectric fluid.

19. The method of claim 18, further comprising:
guiding a flow of the bubbles towards the vapor-fluid boundary.

20. The method of claim 19, wherein guiding the flow bubbles further includes guiding the flow of the bubbles from contacting the computing components of the PCB.

\* \* \* \* \*